(12) United States Patent
Huang et al.

(10) Patent No.: US 11,930,677 B2
(45) Date of Patent: Mar. 12, 2024

(54) DISPLAY PANEL WITH RESISTANCE-REDUCING TRACE AND SIGNAL LINE CONFIGURED TO REDUCE PEEL-OFF, AND FABRICATING METHOD THEREOF, AND DISPLAYING DEVICE

(71) Applicants: Hefei Xinsheng Optoelectronics Technology Co., Ltd., Anhui (CN); BOE Technology Group Co., Ltd., Beijing (CN)

(72) Inventors: Yongchao Huang, Beijing (CN); Can Yuan, Beijing (CN); Liusong Ni, Beijing (CN); Chao Wang, Beijing (CN); Jiawen Song, Beijing (CN); Zhiwen Luo, Beijing (CN); Jun Liu, Beijing (CN); Leilei Cheng, Beijing (CN); Qinghe Wang, Beijing (CN); Tao Sun, Beijing (CN)

(73) Assignees: HEFEI XINSHENG OPTOELECTRONICS TECHNOLOGY CO., LTD., Anhui (CN); BOE TECHNOLOGY GROUP CO., LTD., Beijing (CN)

(*) Notice: Subject to any disclaimer, the term of this patent is extended or adjusted under 35 U.S.C. 154(b) by 404 days.

(21) Appl. No.: 17/329,349

(22) Filed: May 25, 2021

(65) Prior Publication Data

US 2022/0115493 A1 Apr. 14, 2022

(30) Foreign Application Priority Data

Oct. 13, 2020 (CN) .......................... 202011090160.1

(51) Int. Cl.
*H10K 59/131* (2023.01)
*H10K 59/12* (2023.01)
(Continued)

(52) U.S. Cl.
CPC ....... *H10K 59/1315* (2023.02); *H10K 59/126* (2023.02); *H10K 59/38* (2023.02); *H10K 71/00* (2023.02); *H10K 59/1201* (2023.02)

(58) Field of Classification Search
CPC ............ H10K 59/1201; H10K 59/126; H10K 59/131; H10K 59/1315; H10K 59/38;
(Continued)

(56) References Cited

U.S. PATENT DOCUMENTS 6,275,275 B1* 8/2001 Ha ........................ H01L 27/124
257/E27.111
7,696,625 B2* 4/2010 Isa ....................... H01L 23/5329
257/E23.06
(Continued)

FOREIGN PATENT DOCUMENTS

CN 106935598 A 7/2017
CN 111129040 A 5/2020
(Continued)

OTHER PUBLICATIONS

Office Action dated Jul. 21, 2022, issued in counterpart CN application No. 202011090160.1, with English machine translation. (17 pages).

*Primary Examiner* — Matthew E. Gordon
(74) *Attorney, Agent, or Firm* — WHDA, LLP (57) ABSTRACT

A display panel and a fabricating method thereof, and a displaying device. The display panel includes a substrate, a resistance reducing trace, an inter-layer-medium layer and a signal line. The substrate is divided into a plurality of sub-pixel regions and a pixel separating region. The resistance reducing trace is provided on the pixel separating region of the substrate. The inter-layer-medium layer is provided on the substrate, and the inter-layer-medium layer has an opening exposing the resistance reducing trace. The signal line is provided within the opening, the signal line is connected to the resistance reducing trace, the signal line is distributed in a column direction along the display panel, and in a row direction along the display panel, a width of the opening is greater than or equal to a width of the signal line.

16 Claims, 4 Drawing Sheets

(51) Int. Cl.
*H10K 59/126* (2023.01)
*H10K 59/38* (2023.01)
*H10K 71/00* (2023.01)

(58) Field of Classification Search
CPC .. H10K 59/8792; H10K 50/865; H10K 71/00; H10K 71/40; H10K 71/421; H10K 71/441
USPC .......................................................... 257/40
See application file for complete search history.

(56) References Cited

U.S. PATENT DOCUMENTS

| | | | |
|---|---|---|---|
| 9,123,632 B2* | 9/2015 | Yamazaki | H01L 29/20 |
| 2003/0193056 A1* | 10/2003 | Takayama | H10K 59/1315 |
| | | | 257/E27.111 |
| 2019/0140043 A1* | 5/2019 | Wang | G09G 3/3225 |
| 2020/0119054 A1* | 4/2020 | Fang | H01L 27/1248 |
| 2021/0267053 A1* | 8/2021 | Huang | H05K 3/04 |

FOREIGN PATENT DOCUMENTS

| | | |
|---|---|---|
| CN | 111180470 A | 5/2020 |
| KR | 20180012942 A | 2/2018 |

* cited by examiner

DISPLAY PANEL WITH RESISTANCE-REDUCING TRACE AND SIGNAL LINE CONFIGURED TO REDUCE PEEL-OFF, AND FABRICATING METHOD THEREOF, AND DISPLAYING DEVICE

CROSS REFERENCE TO RELEVANT APPLICATIONS

The present disclosure claims the priority of the Chinese patent application filed on Oct. 13, 2020 before the Chinese Patent Office with the application number of 202011090160.1 and the title of "DISPLAY PANEL AND FABRICATING METHOD THEREOF, AND DISPLAYING DEVICE", which is incorporated herein in its entirety by reference.

TECHNICAL FIELD

The present disclosure relates to the technical field of displaying, and particularly relates to a display panel and a fabricating method thereof, and a displaying device.

BACKGROUND

With the development of displaying techniques, Organic Light Emitting Diode (OLED) displaying devices, because of their advantages such as a low energy consumption, a low production cost, self-illumination, a wide visual angle and a high response speed, have been paid much attention.

SUMMARY

The present disclosure provides a display panel and a fabricating method thereof, and a displaying device.

The present disclosure discloses a display panel, wherein the display panel comprises:
- a substrate, wherein the substrate is divided into a plurality of sub-pixel regions and a pixel separating region located between two neighboring columns of the sub-pixel regions;
- a resistance reducing trace, wherein the resistance reducing trace is provided on the pixel separating region of the substrate;
- an inter-layer-medium layer, wherein the inter-layer-medium layer is provided on the substrate, and the inter-layer-medium layer has an opening exposing the resistance reducing trace; and
- a signal line, wherein the signal line is provided within the opening, the signal line is connected to the resistance reducing trace, the signal line is distributed in a column direction along the display panel, and in a row direction along the display panel, a width of the opening is greater than or equal to a width of the signal line.

Optionally, in a direction perpendicular to the display panel, a difference between a thickness of the inter-layer-medium layer and a sum between a thickness of the resistance reducing trace and a thickness of the signal line is 0 to 1000 Å.

Optionally, the resistance reducing trace is distributed in the column direction along the display panel; and
in the row direction along the display panel, the width of the signal line is equal to a width of the resistance reducing trace.

Optionally, the signal line comprises a VDD signal line and/or a sensing signal line.

Optionally, the substrate located within the pixel separating region comprises a base plate and a buffer layer provided on the base plate, and the base plate is provided on one side of the buffer layer that is further away from the inter-layer-medium layer.

Optionally, the display panel further comprises:
- a passivation layer, wherein the passivation layer covers the inter-layer-medium layer and the signal line;
- a color-film layer, wherein the color-film layer is provided on the passivation layer; and
- a flat layer, wherein the flat layer covers the color-film layer.

Optionally, the display panel further comprises a grid layer and a source-drain electrode layer that are provided in each of the sub-pixel regions; and
the resistance reducing trace and the grid layer are formed by using a same patterning process, and the signal line and the source-drain electrode layer are formed by using a same patterning process.

Optionally, the display panel further comprises a passivation layer, a color-film layer, a flat layer, and a light emitting device that is provided on the flat layer, and the light emitting device comprises an anode layer, an organic functional layer and a cathode layer that are provided in stack; and
the anode layer is provided on the flat layer, and is connected to the source-drain electrode layer via a third via hole penetrating the flat layer and the passivation layer.

Optionally, the color-film layer comprises a plurality of color-film units that are distributed in an array, and each of the color-film units comprises a plurality of color blocking units; and
the color-film layer is for performing color filtering to an emitted light ray of the light emitting device.

Optionally, the substrate comprises a base plate, a light shielding layer provided on the base plate, and a buffer layer that covers the light shielding layer and the base plate;
the display panel located within the sub-pixel regions further comprises an active layer provided on the buffer layer; and
the source-drain electrode layer is connected to the active layer via a first via hole penetrating the inter-layer-medium layer, and the source-drain electrode layer is connected to the light shielding layer via a second via hole penetrating the inter-layer-medium layer and the buffer layer.

Optionally, the display panel further comprises a packaging layer, the packaging layer comprises at least one organic packaging layer and at least one inorganic packaging layer, and the packaging layer covers the light emitting device.

Optionally, the packaging layer comprises a first inorganic packaging layer, the organic packaging layer and a second inorganic packaging layer that are provided sequentially in stack on the cathode layer.

The present disclosure further discloses a method for fabricating a display panel, wherein the method comprises:
- providing a substrate, wherein the substrate is divided into a plurality of sub-pixel regions and a pixel separating region located between two neighboring columns of the sub-pixel regions;
- forming a resistance reducing trace on the substrate within the pixel separating region;
- forming an inter-layer-medium layer on the substrate, wherein the inter-layer-medium layer has an opening exposing the resistance reducing trace; and forming a signal line within the opening, wherein the signal line is connected to the resistance reducing trace, the signal line is distributed in a column direction along the display panel, and in a row direction along the display panel, a width of the opening is greater than or equal to a width of the signal line.

Optionally, after the step of providing the substrate, the method further comprises:

forming an active layer on the substrate located within each of the sub-pixel regions;

forming a grid insulating layer on the active layer; and forming a grid layer on the grid insulating layer, wherein the resistance reducing trace and the grid layer are formed by using a same patterning process.

Optionally, after the step of forming the signal line within the opening, the method further comprises:

forming a passivation layer that covers the inter-layer-medium layer and the signal line;

forming a color-film layer on the passivation layer; and forming a flat layer covering the color-film layer.

The present disclosure further discloses a displaying device, wherein the displaying device comprises the display panel stated above.

The above description is merely a summary of the technical solutions of the present disclosure. In order to more clearly know the elements of the present disclosure to enable the implementation according to the contents of the description, and in order to make the above and other purposes, features and advantages of the present disclosure more apparent and understandable, the particular embodiments of the present disclosure are provided below.

BRIEF DESCRIPTION OF THE DRAWINGS

In order to more clearly illustrate the technical solutions of the embodiments of the present disclosure or the related art, the figures that are required to describe the embodiments or the related art will be briefly introduced below. Apparently, the figures that are described below are merely embodiments of the present disclosure, and a person skilled in the art can obtain other figures according to these figures without paying creative work.

DETAILED DESCRIPTION

In order to make the above purposes, features and advantages of the present disclosure more apparent and understandable, the present disclosure will be described in further detail below with reference to the drawings and the particular embodiments. Apparently, the described embodiments are merely certain embodiments of the present disclosure, rather than all of the embodiments. All of the other embodiments that a person skilled in the art obtains on the basis of the embodiments of the present disclosure without paying creative work fall within the protection scope of the present disclosure.

Figure 1:
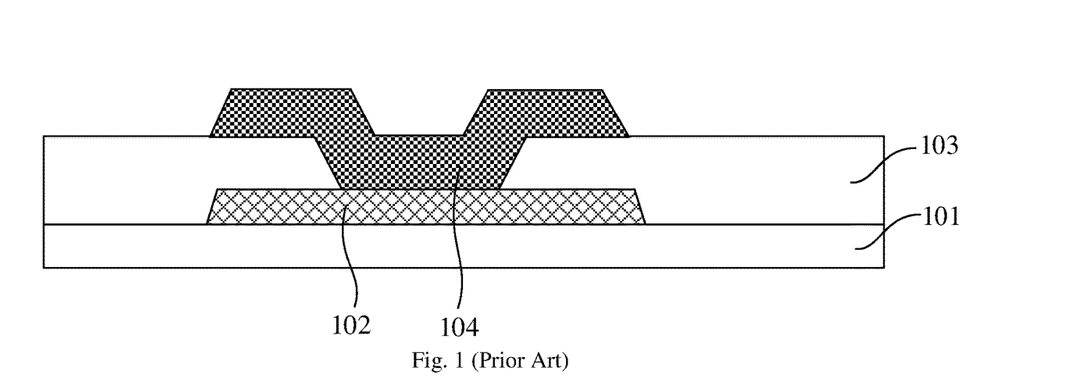
FIG. 1 shows a schematic structural diagram of a display panel located within a pixel separating region in the related art.

As shown in FIG. 1, a display panel within a pixel separating region located between two neighboring columns of the sub-pixel regions comprises: a substrate 101, a resistance reducing trace 102 provided on the substrate 101, an inter-layer-medium layer 103 that covers the resistance reducing trace 102 and the substrate 101, and a signal line 104 provided on the inter-layer-medium layer 103, wherein the signal line 104 is connected to the resistance reducing trace 102 via a via hole penetrating the inter-layer-medium layer 103, to reduce the line resistance of the signal line 104 by using the resistance reducing trace 102.

Because the signal line 104 is provided on the inter-layer-medium layer 103, the signal line 104 protrudes out of the inter-layer-medium layer 103, which results in that the display panel located within the pixel separating region has a segment gap. Therefore, subsequently, in the formation of the flat layer, the thickness of the flat layer at the protrusion is low, and the problem of a poor effect of planarization, or even peeling-off of the flat layer, readily emerges, which affects the reliability of the products.

Figure 2:
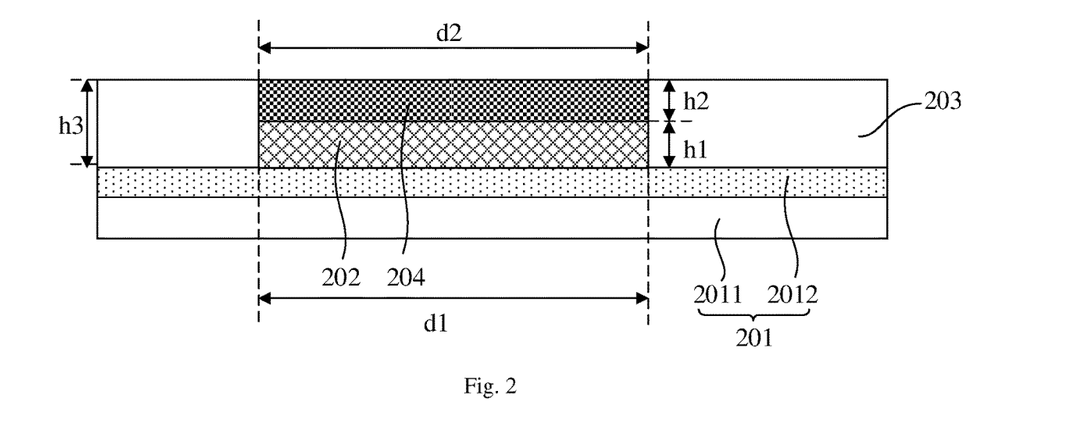
FIG. 2 shows a schematic structural diagram of the display panel located within the pixel separating region according to an embodiment of the present disclosure.
Figure 7:
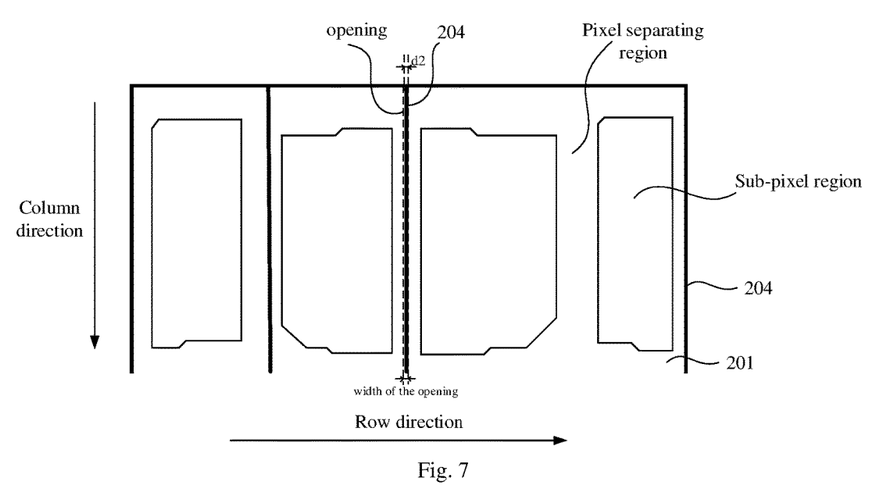
FIG. 7 shows a schematic diagram of the pixel layout of the display panel according to an embodiment of the present disclosure.

Referring to FIG. 2 and FIG. 7, FIG. 2 shows a schematic structural diagram of the display panel located within the pixel separating region according to an embodiment of the present disclosure, and FIG. 7 shows a schematic diagram of the pixel layout of the display panel according to an embodiment of the present disclosure.

An embodiment of the present disclosure provides a display panel, wherein the display panel comprises: a substrate 201, wherein the substrate 201 is divided into a plurality of sub-pixel regions and a pixel separating region located between two neighboring columns of the sub-pixel regions; a resistance reducing trace 202 provided on the substrate 201 within the pixel separating region; an inter-layer-medium layer 203 provided on the substrate 201, wherein the inter-layer-medium layer 203 has an opening exposing the resistance reducing trace 202; and a signal line 204 provided within the opening, wherein the signal line 204 is connected to the resistance reducing trace 202, the signal line 204 is distributed in the column direction along the display panel, and in the row direction along the display panel, the width of the opening is greater than or equal to the width of the signal line 204.

Particularly, the substrate 201 comprises a displaying region and a non-displaying region surrounding the displaying region, and the displaying region is divided into a plurality of sub-pixel regions and a pixel separating region located between two neighboring columns of the sub-pixel regions, wherein the sub-pixel regions refer to the regions where the light emitting sub-pixels formed subsequently are located, and the region between two neighboring columns of the sub-pixel regions is referred to as the pixel separating region.

The resistance reducing trace 202 is provided on the substrate 201 within the pixel separating region. The material of the resistance reducing trace 202 is a metal material. For example, the material of the resistance reducing trace 202 is copper.

Moreover, the display panel further comprises the inter-layer-medium layer 203 provided on the substrate 201. The material of the inter-layer-medium layer 203 is an inorganic material, for example, at least one of silicon nitride and silicon dioxide. The inter-layer-medium layer 203 has an opening penetrating it. The opening may expose the resistance reducing trace 202 provided on the substrate 201. Furthermore, in the row direction along the display panel, the dimension of the opening is greater than the dimension of the via hole penetrating an inter-layer-medium layer in the related art.

It should be noted that the row direction along the display panel refers to the direction of extension of the grid lines (i.e., the Gate lines) of the display panel, and the column direction along the display panel refers to the direction of extension of the data lines (i.e., the Data lines) of the display panel. Moreover, in the area outside the resistance reducing trace 202, the inter-layer-medium layer 203 covers the substrate 201.

The signal line 204 is provided within the opening of the inter-layer-medium layer 203. The signal line 204 directly contacts and connects to the resistance reducing trace 202, to reduce the line resistance of the signal line 204 by using the resistance reducing trace 202. Furthermore, the signal line 204 is distributed in the column direction along the display panel, and in the row direction along the display panel, the width of the opening is greater than or equal to the width of the signal line 204. In this case, the signal line 204 is merely within the opening, and does not exceed the surface of the inter-layer-medium layer 203, and the signal line 204 and the resistance reducing trace 202 do not have the inter-layer-medium layer 203 therebetween. The material of the signal line 204 is a metal material. For example, the material of the signal line 204 is copper.

In the present disclosure, the inter-layer-medium layer 203 is etched, whereby the inter-layer-medium layer 203 has the opening exposing the resistance reducing trace 202; and the signal line 204 is provided within the opening, and the width of the opening is greater than or equal to the width of the signal line 204. Therefore, the signal line 204 is merely within the opening, and does not exceed the surface of the inter-layer-medium layer 203 that is further away from the substrate 201. Therefore, the signal line 204 does not protrude out of the inter-layer-medium layer 203, which reduces the segment gap of the display panel located within the pixel separating region. Subsequently, in the formation of the flat layer, the thicknesses of the flat layer within the regions are even, which obtains a good effect of planarization. Therefore, the present disclosure reduces the risk of peeling-off of the flat layer caused by segment gap of the pixel separating region, which improves the reliability of the product.

In an embodiment of the present disclosure, the substrate 201 located within the pixel separating region may merely comprise a base plate 2011. In this case, the resistance reducing trace 202 is provided directly on the base plate 2011, and the inter-layer-medium layer 203 is also provided on the base plate 2011. The base plate 2011 may be a glass base plate, a quartz base plate, a metal base plate, a resin base plate and so on. Alternatively, the substrate 201 located within the pixel separating region comprises the base plate 2011 and a buffer layer 2012 provided on the base plate 2011, and the base plate 2011 is provided on one side of the buffer layer 2012 that is further away from the inter-layer-medium layer 203. In this case, the resistance reducing trace 202 is provided on the buffer layer 2012, and the inter-layer-medium layer 203 is also provided on the buffer layer 2012. The material of the buffer layer 2012 is an inorganic material, for example, at least one of silicon nitride and silicon dioxide.

In the direction perpendicular to the display panel, the difference between the thickness h3 of the inter-layer-medium layer 203 and the sum between the thickness of the resistance reducing trace 202 and the thickness of the signal line 204 is 0 to 1000 Å.

As shown in FIG. 2, the thickness of the resistance reducing trace 202 is h1, the thickness of the signal line 204 is h2, and the sum between the thickness of the resistance reducing trace 202 and the thickness of the signal line 204 is h1+h2. Therefore, the difference between the thickness h3 of the inter-layer-medium layer 203 and the sum between the thickness of the resistance reducing trace 202 and the thickness of the signal line 204 is H=h3−(h1+h2), and the difference H is 0 to 1000 Å. For example, the difference H may be 0, 500 Å, 600 Å, 1000 Å and so on.

When the difference H is equal to 0, the thickness of the inter-layer-medium layer 203 is equal to the sum between the thickness of the resistance reducing trace 202 and the thickness of the signal line 204, and in this case, the surface of the signal line 204 that is further away from the substrate 201 and the surface of the inter-layer-medium layer 203 that is further away from the substrate 201 are located in the same one plane. When the difference H is greater than 0, the thickness of the inter-layer-medium layer 203 is greater than the sum between the thickness of the resistance reducing trace 202 and the thickness of the signal line 204, and in this case, the surface of the signal line 204 that is further away from the substrate 201 depresses with respect to the surface of the inter-layer-medium layer 203 that is further away from the substrate 201.

The thickness of the inter-layer-medium layer 203 is 5500 Å to 6000 Å. The thickness of the resistance reducing trace 202 is 4000 Å to 4500 Å. According to the thickness of the signal line 204 that is required to set, the difference between the thickness of the inter-layer-medium layer 203 and the sum between the thickness of the resistance reducing trace 202 and the thickness of the signal line 204 is set to be 0 to 1000 Å.

For example, when the thickness of the inter-layer-medium layer 203 is equal to the sum between the thickness of the resistance reducing trace 202 and the thickness of the signal line 204, the thickness of the inter-layer-medium layer 203 may be set to be 5500 Å, the thickness of the resistance reducing trace 202 may be set to be 4500 Å, and the thickness of the signal line 204 may be set to be 1000 Å.

In an embodiment of the present disclosure, the resistance reducing trace 202 is also distributed in the column direction along the display panel, and in the row direction along the display panel, the width d2 of the signal line 204 and the width d1 of the resistance reducing trace 202 are equal.

In the formation of the opening penetrating the inter-layer-medium layer 203, the width of the opening in the row direction along the display panel and the width of the resistance reducing trace 202 may be set to be equal. Therefore, in the formation of the signal line 204 within the opening, if the width of the opening in the row direction along the display panel is also equal to the width of the signal line 204 in the row direction along the display panel, then in the row direction along the display panel, the width of the signal line 204 and the width of the resistance reducing trace 202 are also equal.

In the row direction along the display panel, the width d1 of the resistance reducing trace 202 is 8 μm to 10 μm, and therefore the width d2 of the signal line 204 is also 8 μm to 10 μm, and is equal to the width d1 of the resistance reducing trace 202.

For example, when the width d1 of the resistance reducing trace 202 is 8 μm, the width d2 of the signal line 204 is also 8 μm. When the width d1 of the resistance reducing trace 202 is 9 μm, the width d2 of the signal line 204 is also 9 μm. When the width d1 of the resistance reducing trace 202 is 10 μm, the width d2 of the signal line 204 is also 10 μm.

The conventional via holes penetrating the inter-layer-medium layer have a small size, and in the row direction along the display panel, the width of the signal line contacting the resistance reducing trace is far less than the width of the resistance reducing trace. However, in the embodiments of the present disclosure, in the row direction along the display panel, the width of the signal line 204 and the width of the resistance reducing trace 202 are equal, and, because, in the row direction along the display panel, all of the signal lines 204 are located within the opening, the width of the signal line 204 contacting the resistance reducing trace 202 is then equal to the width of the resistance reducing trace 202, which increases the contact area between the signal line 204 and the resistance reducing trace 202, and further reduces the line resistance of the signal line 204.

In this case, in the column direction along the display panel, the length of the resistance reducing trace 202 may be set to be equal to the length of conventional resistance reducing traces, and, in the column direction along the display panel, the length of the resistance reducing trace 202 and the length of the signal line 204 may be equal, and may also be not equal.

In an embodiment of the present disclosure, the signal line 204 comprises a VDD signal line and/or a sensing signal line. The signal line 204 may comprise merely a VDD signal line, may also comprise merely a sensing signal line, and may also comprise both of a VDD signal line and a sensing signal line.

The VDD signal line is used for providing a VDD signal to a pixel driving circuit located within the sub-pixel region. The sensing signal line is a Sense signal line, and is used for providing a sensing signal to the pixel driving circuit located within the sub-pixel region.

It should be noted that the types of the particular traces comprised in the signal line 204 are related to the particular structure of the pixel driving circuit. When the pixel driving circuit requires to connect to the VDD signal line, and receive the VDD signal inputted by the VDD signal line, the signal line 204 comprises the VDD signal line. When the pixel driving circuit requires to connect to the sensing signal line, and receive the sensing signal inputted by the sensing signal line, the signal line 204 comprises the sensing signal line.

Figure 3:
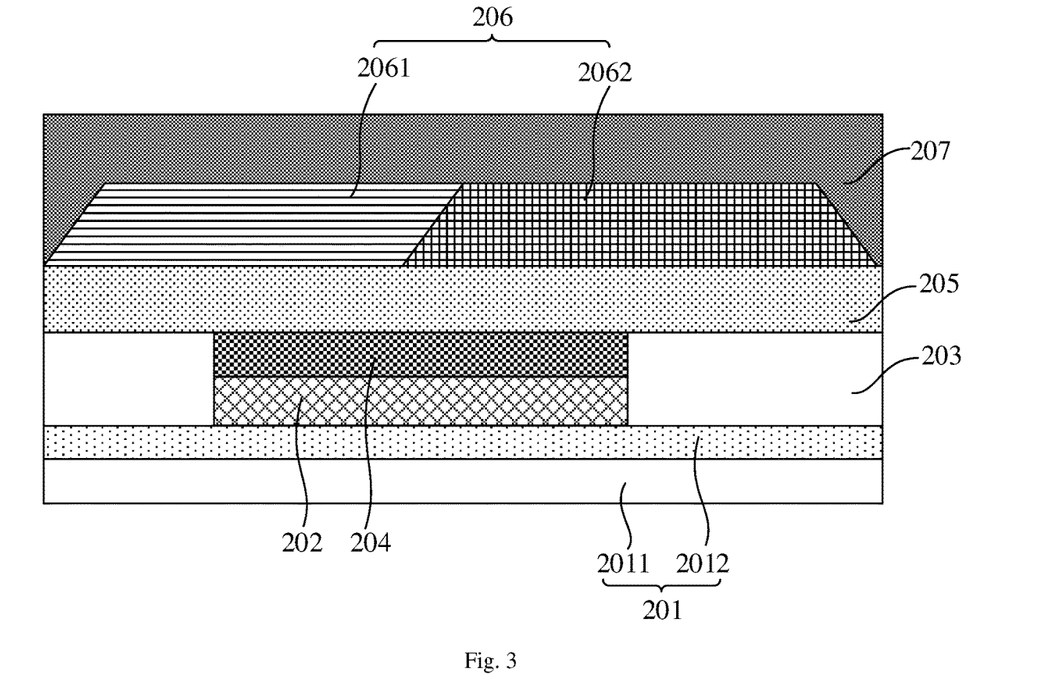
FIG. 3 shows a schematic structural diagram of the display panel located within the pixel separating region according to another embodiment of the present disclosure.

In an embodiment of the present disclosure, as shown in FIG. 3, the display panel further comprises: a passivation layer 205 that covers the inter-layer-medium layer 203 and the signal line 204; a color-film layer 206 provided on the passivation layer 205; and a flat layer 207 covering the color-film layer 206.

The display panel located within the pixel separating region further comprises a passivation layer 205 that covers the inter-layer-medium layer 203 and the signal line 204. The material of the passivation layer 205 is an inorganic material, for example, at least one of silicon nitride and silicon dioxide.

A color-film layer 206 is provided on the passivation layer 205, and the color-film layer 206 is for performing color filtering to the emitted light ray of the light emitting device. The color-film layer 206 comprises a plurality of color-film units that are distributed in an array. Each of the color-film units comprises a plurality of color blocking units; for example, each of the color-film units comprises a first color blocking unit, a second color blocking unit and a third color blocking unit. The first color blocking unit allows red light to pass, and does not allow other light rays than red light to pass. The second color blocking unit allows green light to pass, and does not allow other light rays than green light to pass. The third color blocking unit allows blue light to pass, and does not allow other light rays than blue light to pass.

Particularly, all of the light rays emitted by the light emitting devices formed subsequently may be white light, and the white light undergoes color filtering by the color-film layer 206, to obtain individually red light, green light and blue light, to finally realize color displaying. Alternatively, the light rays emitted by the light emitting devices formed subsequently are the same as the colors of the lights that the corresponding color blocking units allow to pass; in other words, the light ray emitted by the light emitting device corresponding to the first color blocking unit is red light, the light ray emitted by the light emitting device corresponding to the second color blocking unit is green light, and the light ray emitted by the light emitting device corresponding to the third color blocking unit is blue light, and the light rays emitted by the light emitting devices undergo color filtering by the color-film layer 206, which can improve the color gamut of the display panel, to obtain a better displaying effect of the display panel.

In FIG. 3, 2061 may be deemed as the first color blocking unit, 2062 may be deemed as the second color blocking unit, and the pixel separating region is the area where two neighboring columns of the color blocking units overlap.

Moreover, the display panel located within the pixel separating region further comprises a flat layer 207 covering the color-film layer 206, for realizing the planarization of the display panel. The material of the flat layer 207 is an organic material, such as a resin material.

In the related art, because the signal line 104 is provided on the inter-layer-medium layer 103, the signal line 104 protrudes out of the inter-layer-medium layer 103, and, because the color-film layer has a high thickness, within the pixel separating region, two color blocking units also overlap, which further results in that the segment gap of the display panel within the pixel separating region is increased, to cause a poor effect of planarization. However, in the embodiments of the present disclosure, the signal line 204 is provided within the opening of the inter-layer-medium layer 203, and the width of the opening is greater than or equal to the width of the signal line 204, which results in that the signal line 204 is located merely within the opening, and does not exceed the surface of the inter-layer-medium layer 203 that is further away from the substrate 201. Therefore, the signal line 204 does not protrude out of the inter-layer-medium layer 203, which reduces the segment gap of the display panel located within the pixel separating region. Therefore, after the formation of the color-film layer 206 at the pixel separating region, its segment gap is smaller than the segment gap in the related art, and therefore the effect of planarization is better than that of the related art.

Moreover, because the display panel according to the embodiments of the present disclosure has a low segment gap, in the formation of the flat layer 207, the thickness of the flat layer 207 can be reduced, thereby increasing the light-ray transmittance of the display panel, saving the material required by the flat layer 207, and reducing the fabrication cost of the display panel.

Figure 4:
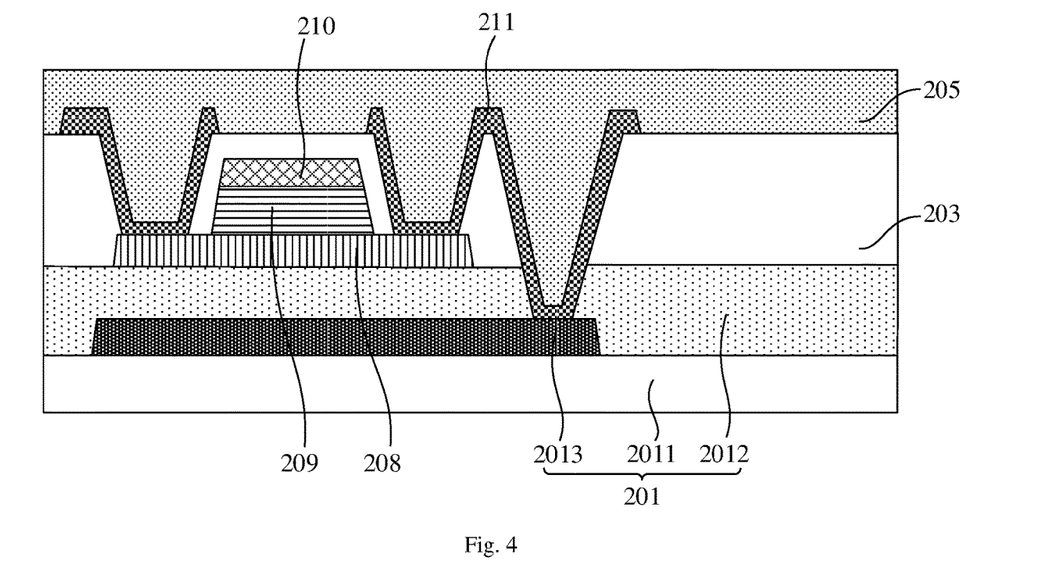
FIG. 4 shows a schematic structural diagram of the display panel located within the sub-pixel regions according to an embodiment of the present disclosure.

The above description is totally with respect to the structure of the display panel located within the pixel separating region. As shown in FIG. 4, the display panel located within the sub-pixel regions comprises the substrate 201, wherein the substrate 201 comprises the base plate 2011, a light shielding layer 2013 provided on the base plate 2011, and the buffer layer 2012 that covers the light shielding layer 2013 and the base plate 2011. Moreover, the display panel located within the sub-pixel regions further comprises an active layer 208 provided on the buffer layer 2012 in the substrate 201, a grid insulating layer 209 provided on the active layer 208, and a grid layer 210 provided on the grid insulating layer 209. The inter-layer-medium layer 203 located within the pixel separating region extends into the sub-pixel region, and the inter-layer-medium layer 203 covers the grid layer 210, the grid insulating layer 209, the active layer 208 and the substrate 201. Moreover, the display panel located within the sub-pixel regions further comprises a source-drain electrode layer 211 provided on the inter-layer-medium layer 203, wherein the source-drain electrode layer 211 is connected to the active layer 208 by a first via hole penetrating the inter-layer-medium layer 203, and the source-drain electrode layer 211 is connected to the light shielding layer 2013 by a second via hole penetrating the inter-layer-medium layer 203 and the buffer layer 2012. The passivation layer 205 located within the pixel separating region extends into the sub-pixel region, and the passivation layer 205 covers the source-drain electrode layer 211 and the inter-layer-medium layer 203.

It should be noted that the material of the light shielding layer 2013 is a metal material. The light shielding layer 2013 is used for shielding the thin-film transistor from light, to prevent the influence by the light ray on the thin-film transistor. Furthermore, the source-drain electrode layer 211 is connected to the light shielding layer 2013 by the second via hole penetrating the inter-layer-medium layer 203 and the buffer layer 2012, in order to transmit the signal in the source-drain electrode layer 211 to the light shielding layer 2013, to prevent the problem that the light shielding layer 2013 does not have a permanent signal and thus has a voltage fluctuation, which affects the performance of the thin-film transistor.

In conclusion, the display panel further comprises the grid layer 210 and the source-drain electrode layer 211 that are provided in each of the sub-pixel regions, the resistance reducing trace 202 and the grid layer 210 are formed by using the same patterning process, and the signal line 204 and the source-drain electrode layer 211 are formed by using the same patterning process.

By configuring that the resistance reducing trace 202 and the grid layer 210 are formed by using the same patterning process, and the signal line 204 and the source-drain electrode layer 211 are formed by using the same patterning process, the resistance reducing trace 202 and the signal line 204 are obtained without adding fabrication steps, which simplifies the fabrication process of the display panel, and reduces the fabrication cost.

Particularly, the grid layer 210 comprises the grid lines distributed in the row direction along the display panel, the grid of the thin-film transistor, and so on, and the source-drain electrode layer 211 comprises the data lines distributed in the column direction along the display panel, the source and the drain of the thin-film transistor, and so on.

It should be noted that the display panel according to the present disclosure may be an OLED display panel. Moreover, the display panel further comprises a light emitting device provided on the flat layer 207 and a packaging layer covering the light emitting device, and the light ray emitted by the light emitting device exits through the color-film layer 206 in the direction toward the substrate 201.

Figure 8:
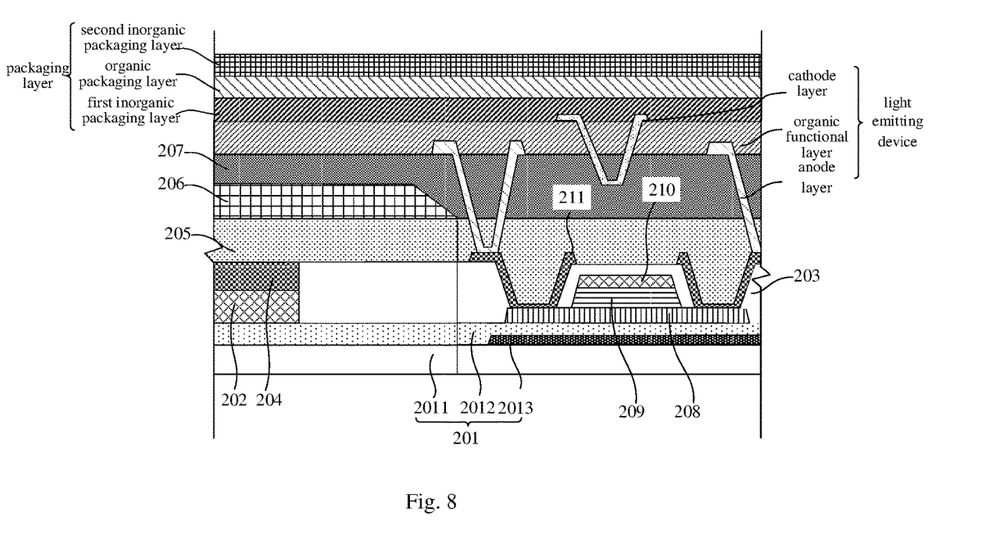
FIG. 8 shows a schematic structural diagram of the display panel according to an embodiment of the present disclosure.

Particularly, referring to FIG. 8, the light emitting device comprises an anode layer, an organic functional layer and a cathode layer that are provided in stack. The anode layer is provided on the flat layer 207, and is connected to the source-drain electrode layer 211 by a third via hole penetrating the flat layer 207 and the passivation layer 205. The organic functional layer may comprise merely a light emitting layer, and may also comprise the film layers such as a hole injection layer, a hole transporting layer, a light emitting layer, an electron transporting layer and an electron injection layer.

The packaging layer may be a thin-film packaging layer, and comprise at least one organic packaging layer and at least one inorganic packaging layer. For example, referring to FIG. 8, the packaging layer comprises a first inorganic packaging layer, the organic packaging layer and a second inorganic packaging layer that are provided sequentially in stack on the cathode layer.

In the embodiments of the present disclosure, by configuring that the signal line is formed within the opening of the inter-layer-medium layer, and the width of the opening is greater than or equal to the width of the signal line, which results in that the signal line is located merely within the opening, and does not exceed the surface of the inter-layer-medium layer, the segment gap of the display panel located within the pixel separating region is reduced, which results in that the thicknesses of the flat layer within the regions formed subsequently are even, which obtains a good effect of planarization. Therefore, the present disclosure reduces the risk of peeling-off of the flat layer caused by segment gap of the pixel separating region, which improves the reliability of the product.

Figure 5:
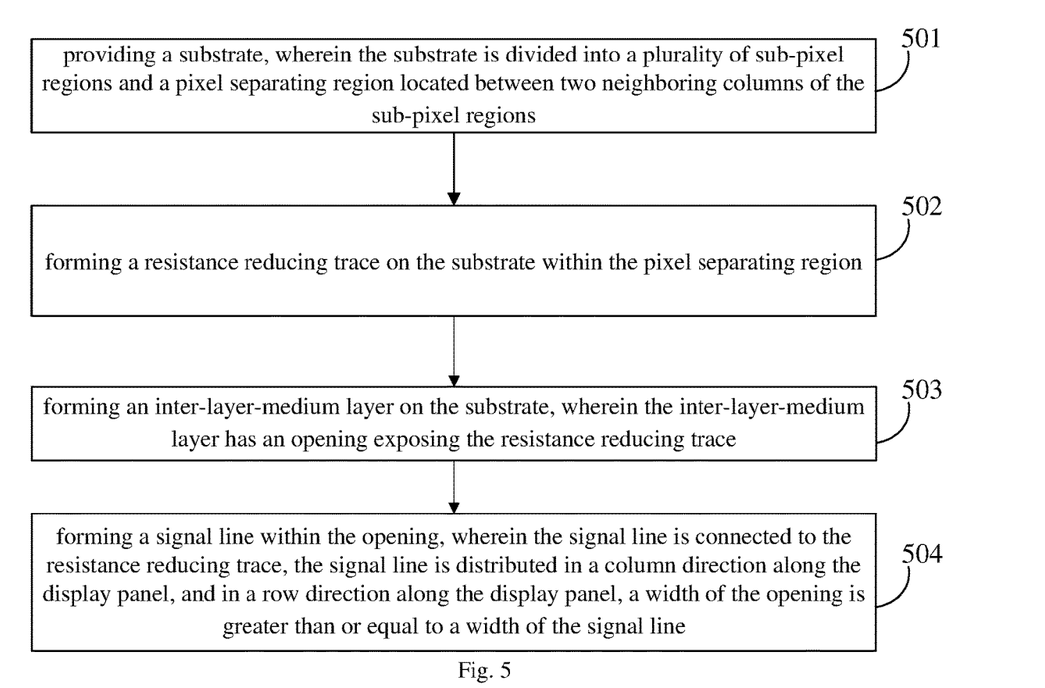
FIG. 5 shows a flow chart of the method for fabricating a display panel according to an embodiment of the present disclosure.

Referring to FIG. 5, FIG. 5 shows a flow chart of the method for fabricating a display panel according to an embodiment of the present disclosure, which may particularly comprise the following steps:

Step 501: providing a substrate, wherein the substrate is divided into a plurality of sub-pixel regions and a pixel separating region located between two neighboring columns of the sub-pixel regions.

In an embodiment of the present disclosure, firstly, a substrate 201 is provided, wherein the substrate is divided into a plurality of sub-pixel regions and a pixel separating region located between two neighboring columns of the sub-pixel regions.

The substrate 201 located within the pixel separating region comprises a base plate 2011 and a buffer layer 2012 provided on the base plate 2011. The substrate 201 located within the sub-pixel regions comprises the base plate 2011, a light shielding layer 2013 provided on the base plate 2011 and the buffer layer 2012 that covers the light shielding layer 2013 and the base plate 2011.

Particularly, firstly the light shielding layer 2013 is formed on the base plate 2011 by using a patterning process, and then the buffer layer 2012 that covers the light shielding layer 2013 and the base plate 2011 is formed by using a depositing process, wherein the buffer layer 2012 is located within the sub-pixel region and the pixel separating region.

Step 502: forming a resistance reducing trace on the substrate within the pixel separating region.

In an embodiment of the present disclosure, after the substrate 201 has been fabricated, an active layer 208 is formed on the buffer layer 2012 in the substrate 201 located within the sub-pixel regions, and then a grid insulating layer 209 is formed on the active layer 208 by using a patterning process. Subsequently, a grid layer 210 is formed on the grid insulating layer 209 within the sub-pixel region, and a resistance reducing trace 202 is formed on the buffer layer 2012 in the substrate 201 within the pixel separating region, wherein the resistance reducing trace 202 and the grid layer 210 are formed by using the same patterning process.

Step 503: forming an inter-layer-medium layer on the substrate, wherein the inter-layer-medium layer has an opening exposing the resistance reducing trace.

In an embodiment of the present disclosure, after the grid layer 210 has been formed on the grid insulating layer 209 within the sub-pixel region and the resistance reducing trace 202 has been formed on the buffer layer 2012 in the substrate 201 within the pixel separating region, an inter-layer-medium layer 203 is formed.

The inter-layer-medium layer 203 located within the pixel separating region is provided on the substrate 201, and the inter-layer-medium layer 203 located within the pixel separating region has an opening exposing the resistance reducing trace 202. Moreover, the inter-layer-medium layer 203 located within the sub-pixel region covers the grid layer 210, the grid insulating layer 209, the active layer 208 and the substrate 201, and a first via hole penetrating the inter-layer-medium layer 203 and a second via hole penetrating the inter-layer-medium layer 203 and the buffer layer 2012 are within the sub-pixel region.

Particularly, firstly, an inter-layer-medium-layer thin film is formed, the inter-layer-medium-layer thin film is spread-coated with a photoresist, and the photoresist is exposed and then developed, to obtain a photoresist reservation region and a photoresist removal region. The inter-layer-medium-layer thin film at the photoresist removal region is etched by using an etching process, to obtain the inter-layer-medium layer 203, wherein the etching process is a dry etching process. In the etching of the inter-layer-medium-layer thin film, a first via hole and a transition hole penetrating the inter-layer-medium layer 203 is formed within the sub-pixel region, and an opening penetrating the inter-layer-medium layer 203 is formed within the pixel separating region. Subsequently, the buffer layer 2012 is treated again at the position of the transition hole by using a patterning process, to form the second via hole penetrating the inter-layer-medium layer 203 and the buffer layer 2012.

Step 504: forming a signal line within the opening, wherein the signal line is connected to the resistance reducing trace, the signal line is distributed in a column direction along the display panel, and in a row direction along the display panel, a width of the opening is greater than or equal to a width of the signal line.

In an embodiment of the present disclosure, after the inter-layer-medium layer 203 has been formed, a metal thin film is deposited on the inter-layer-medium layer 203. Accordingly, the metal thin film will connect to the active layer 208 via the first via hole, connect to the light shielding layer 2013 via the second via hole, and connect to the resistance reducing trace 202 via the opening. Subsequently, the metal thin film is spread-coated with a photoresist, and the photoresist is exposed and then developed, to obtain a photoresist reservation region and a photoresist removal region. The metal thin film at the photoresist-removed region is etched, to obtain the source-drain electrode layer 211 and a signal line 204. Accordingly, the source-drain electrode layer 211 connects to the active layer 208 by the first via hole penetrating the inter-layer-medium layer 203, the source-drain electrode layer 211 connects to the light shielding layer 2013 by the second via hole penetrating the inter-layer-medium layer 203 and the buffer layer 2012, and the signal line 204 connects to the resistance reducing trace 202. In this case, the signal line 204 and the source-drain electrode layer 211 are formed by using the same patterning process.

It should be noted that, in the etching of the metal thin film, the metal thin film on the inter-layer-medium layer 203 located within the pixel separating region is entirely etched off, and merely the metal thin film within the opening is reserved, which results in that the signal line 204 is formed merely within the opening.

Figure 6:
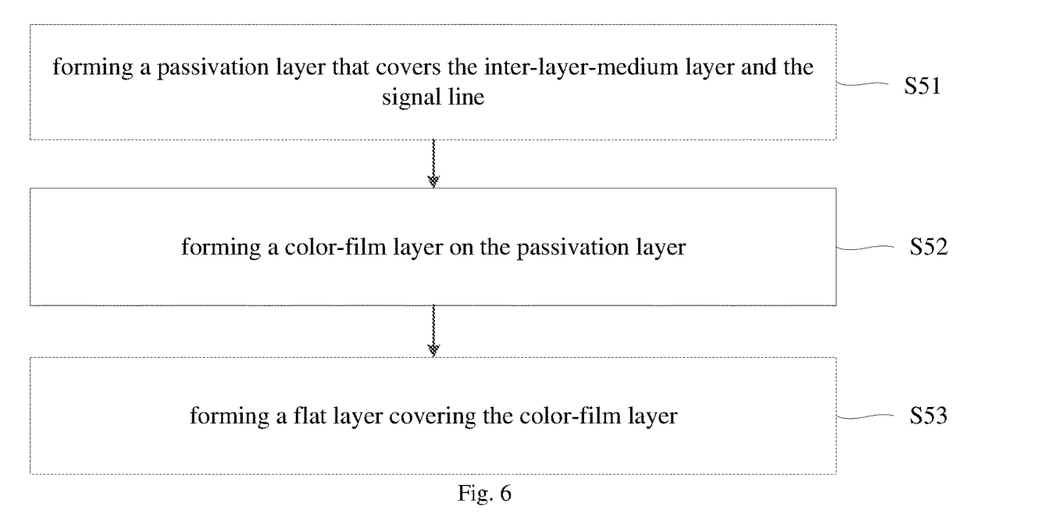
FIG. 6 shows another flow chart of the method for fabricating a display panel according to an embodiment of the present disclosure.

Optionally, referring to FIG. 6, after the step 504, the method further comprises a step S51, a step S52 and a step S53:

Step S51: forming a passivation layer that covers the inter-layer-medium layer and the signal line;

Step S52: forming a color-film layer on the passivation layer; and

Step S53: forming a flat layer covering the color-film layer.

After the source-drain electrode layer 211 and the signal line 204 have been formed, a passivation layer 205 is formed. The passivation layer 205 located within the pixel separating region covers the inter-layer-medium layer 203 and the signal line 204, and the passivation layer 205 located within the sub-pixel region covers the source-drain electrode layer 211 and the inter-layer-medium layer 203.

After the passivation layer 205 has been formed, a color-film layer 206 is formed on the passivation layer 205, wherein the color-film layer 206 is located within the pixel separating region and the sub-pixel region. The color-film layer 206 comprises a plurality of color-film units that are distributed in an array. Each of the color-film units comprises a plurality of color blocking units, and the pixel separating region is the area where two neighboring columns of the color blocking units overlap.

After the color-film layer 206 has been formed, a flat layer 207 is formed. The flat layer 207 located within the pixel separating region covers the color-film layer 206, and the flat layer 207 located within the sub-pixel region covers the color-film layer 206 and the passivation layer 205.

In the embodiments of the present disclosure, by configuring that the signal line is formed within the opening of the inter-layer-medium layer, and the width of the opening is greater than or equal to the width of the signal line, which results in that the signal line is located merely within the opening, and does not exceed the surface of the inter-layer-medium layer, the segment gap of the display panel located within the pixel separating region is reduced, which results in that the thicknesses of the flat layer within the regions formed subsequently are even, which obtains a good effect of planarization. Therefore, the present disclosure reduces the risk of peeling-off of the flat layer caused by segment gap of the pixel separating region, which improves the reliability of the product.

An embodiment of the present disclosure provides a displaying device, wherein the displaying device comprises the display panel stated above.

The particular description on the display panel may refer to the description on the above embodiments, and is not discussed further in the embodiments of the present disclosure.

Certainly, the displaying device further comprises a touch-controlling panel, and so on, provided on the light exiting side of the display panel. Moreover, the displaying device further comprises components such as a driving chip and a Timer Control Register (TCON).

In practical applications, the displaying device may be any products or components that have the function of displaying, such as a mobile phone, a tablet personal computer, a display, a notebook computer and a navigator.

In the embodiments of the present disclosure, by configuring that the signal line is formed within the opening of the inter-layer-medium layer, and the width of the opening is greater than or equal to the width of the signal line, which results in that the signal line is located merely within the opening, and does not exceed the surface of the inter-layer-medium layer, the segment gap of the display panel located within the pixel separating region is reduced, which results in that the thicknesses of the flat layer within the regions formed subsequently are even, which obtains a good effect of planarization. Therefore, the present disclosure reduces the risk of peeling-off of the flat layer caused by segment gap of the pixel separating region, which improves the reliability of the product.

Regarding the above-described process embodiments, for brevity of the description, all of them are expressed as the combination of a series of actions, but a person skilled in the art should know that the present disclosure is not limited by the sequences of the actions that are described, because, according to the present disclosure, some of the steps may have other sequences or be performed simultaneously. Secondly, a person skilled in the art should also know that all of the embodiments described in the description are preferable embodiments, and not all of the actions and the modules that they involve are required by the present disclosure.

The embodiments of the description are described in the mode of progression, each of the embodiments emphatically describes the differences from the other embodiments, and the same or similar parts of the embodiments may refer to each other.

Finally, it should also be noted that, in the present text, relation terms such as first and second are merely intended to distinguish one entity or operation from another entity or operation, and that does not necessarily require or imply that those entities or operations have therebetween any such actual relation or order. Furthermore, the terms "include", "comprise" or any variants thereof are intended to cover non-exclusive inclusions, so that processes, methods, articles or devices that include a series of elements do not only include those elements, but also include other elements that are not explicitly listed, or include the elements that are inherent to such processes, methods, articles or devices. Unless further limitation is set forth, an element defined by the wording "comprising a . . . " does not exclude additional same element in the process, method, article or device comprising the element.

The display panel and the fabricating method thereof, and the displaying device according to the present disclosure have been described in detail above. The principle and the embodiments of the present disclosure are described herein with reference to the particular examples, and the description of the above embodiments is merely intended to facilitate to understand the method according to the present disclosure and its core concept. Moreover, for a person skilled in the art, according to the concept of the present disclosure, the particular embodiments and the range of application may be varied. In conclusion, the contents of the description should not be understood as limiting the present disclosure.

The invention claimed is:

1. A display panel, wherein the display panel comprises:
   a substrate, wherein the substrate is divided into a plurality of sub-pixel regions and a pixel separating region located between two neighboring columns of the sub-pixel regions;
   a resistance reducing trace, wherein the resistance reducing trace is provided on the pixel separating region of the substrate;
   an inter-layer-medium layer, wherein the inter-layer-medium layer is provided on the substrate, and the inter-layer-medium layer has an opening exposing the resistance reducing trace; and
   a signal line, wherein the signal line is provided within the opening, the signal line is connected to the resistance reducing trace, the signal line is distributed in a column direction along the display panel, and in a row direction along the display panel, a width of the opening is greater than or equal to a width of the signal line.

2. The display panel according to claim 1, wherein in a direction perpendicular to the display panel, a difference between a thickness of the inter-layer-medium layer and a sum between a thickness of the resistance reducing trace and a thickness of the signal line is 0 to 1000 Å.

3. The display panel according to claim 1, wherein the resistance reducing trace is distributed in the column direction along the display panel; and
   in the row direction along the display panel, the width of the signal line is equal to a width of the resistance reducing trace.

4. The display panel according to claim 1, wherein the signal line comprises a VDD signal line and/or a sensing signal line.

5. The display panel according to claim 1, wherein the substrate located within the pixel separating region comprises a base plate and a buffer layer provided on the base plate, and the base plate is provided on one side of the buffer layer that is further away from the inter-layer-medium layer.

6. The display panel according to claim 1, wherein the display panel further comprises:
   a passivation layer, wherein the passivation layer covers the inter-layer-medium layer and the signal line;
   a color-film layer, wherein the color-film layer is provided on the passivation layer; and
   a flat layer, wherein the flat layer covers the color-film layer.

7. The display panel according to claim 1, wherein the display panel further comprises a grid layer and a source-drain electrode layer that are provided in each of the sub-pixel regions; and
   the resistance reducing trace and the grid layer are formed by using a same patterning process, and the signal line and the source-drain electrode layer are formed by using a same patterning process.

8. The display panel according to claim 7, wherein the display panel further comprises a passivation layer, a color-film layer, a flat layer, and a light emitting device that is provided on the flat layer, and the light emitting device comprises an anode layer, an organic functional layer and a cathode layer that are provided in stack; and
   the anode layer is provided on the flat layer, and is connected to the source-drain electrode layer via a third via hole penetrating the flat layer and the passivation layer.

9. The display panel according to claim 8, wherein the color-film layer comprises a plurality of color-film units that are distributed in an array, and each of the color-film units comprises a plurality of color blocking units; and the color-film layer is for performing color filtering to an emitted light ray of the light emitting device.

10. The display panel according to claim 9, wherein the substrate comprises a base plate, a light shielding layer provided on the base plate, and a buffer layer that covers the light shielding layer and the base plate;

the display panel located within the sub-pixel regions further comprises an active layer provided on the buffer layer; and the source-drain electrode layer is connected to the active layer via a first via hole penetrating the inter-layer-medium layer, and the source-drain electrode layer is connected to the light shielding layer via a second via hole penetrating the inter-layer-medium layer and the buffer layer.

11. The display panel according to claim 8, wherein the display panel further comprises a packaging layer, the packaging layer comprises at least one organic packaging layer and at least one inorganic packaging layer, and the packaging layer covers the light emitting device.

12. The display panel according to claim 11, wherein the packaging layer comprises a first inorganic packaging layer, the organic packaging layer and a second inorganic packaging layer that are provided sequentially in stack on the cathode layer.

13. A displaying device, wherein the displaying device comprises the display panel according to claim 1.

14. A method for fabricating a display panel, wherein the method comprises:

providing a substrate, wherein the substrate is divided into a plurality of sub-pixel regions and a pixel separating region located between two neighboring columns of the sub-pixel regions;

forming a resistance reducing trace on the substrate within the pixel separating region;

forming an inter-layer-medium layer on the substrate, wherein the inter-layer-medium layer has an opening exposing the resistance reducing trace; and forming a signal line within the opening, wherein the signal line is connected to the resistance reducing trace, the signal line is distributed in a column direction along the display panel, and in a row direction along the display panel, a width of the opening is greater than or equal to a width of the signal line.

15. The method according to claim 14, wherein after the step of providing the substrate, the method further comprises:

forming an active layer on the substrate located within each of the sub-pixel regions;

forming a grid insulating layer on the active layer; and forming a grid layer on the grid insulating layer, wherein the resistance reducing trace and the grid layer are formed by using a same patterning process.

16. The method according to claim 14, wherein after the step of forming the signal line within the opening, the method further comprises:

forming a passivation layer that covers the inter-layer-medium layer and the signal line;

forming a color-film layer on the passivation layer; and forming a flat layer covering the color-film layer.

\* \* \* \* \*